(12) United States Patent
Song (10) Patent No.: US 8,675,386 B2
(45) Date of Patent: Mar. 18, 2014

(54) MEMORY DEVICE HAVING RESISTANCE UNIT

(75) Inventor: Seok-Pyo Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 151 days.

(21) Appl. No.: 12/981,135

(22) Filed: Dec. 29, 2010

(65) Prior Publication Data

US 2012/0014159 A1  Jan. 19, 2012

(30) Foreign Application Priority Data

Jul. 15, 2010  (KR) ........................ 10-2010-0068257

(51) Int. Cl.
*G11C 11/00* (2006.01)

(52) U.S. Cl.
USPC ........... 365/148; 365/158; 365/163; 365/171; 365/173; 365/230.06; 257/261

(58) Field of Classification Search
USPC ..................... 365/148, 158, 171, 173, 230.06; 257/261

See application file for complete search history.

(56) References Cited

U.S. PATENT DOCUMENTS

| | | | |
|---|---|---|---|
| 6,741,513 B2* | 5/2004 | Honigschmid et al. .. | 365/230.03 |
| 6,882,563 B2* | 4/2005 | Asao .............................. | 365/158 |
| 7,391,644 B2* | 6/2008 | Cho et al. ...................... | 365/163 |
| 8,102,729 B2* | 1/2012 | Lee et al. ................. | 365/230.06 |
| 2004/0232460 A1* | 11/2004 | Kajiyama ..................... | 257/295 |

FOREIGN PATENT DOCUMENTS

| | | |
|---|---|---|
| JP | 2008-305889 | 12/2008 |
| KR | 1020030003020 | 1/2003 |
| KR | 1020070108016 | 11/2007 |
| KR | 1020100061558 | 6/2010 |

OTHER PUBLICATIONS

Notice of Allowance issued by the Korean Intellectual Property Office on Mar. 30, 2012.

* cited by examiner

*Primary Examiner* — Thao Bui (74) *Attorney, Agent, or Firm* — IP & T Group LLP (57) ABSTRACT

A memory device includes a memory unit including a plurality of first conductive lines and a plurality of second conductive lines that cross the first conductive lines, and a driving unit module coupled with the plurality of the first conductive lines through respective ones of a plurality of contacts and coupled with and the plurality of the second conductive lines through respective ones of the plurality of contacts, wherein as the first conductive lines become farther from the driving unit module along a direction that the second conductive lines extend, the respective contacts of the first conductive lines have lower resistance values.

12 Claims, 7 Drawing Sheets

MEMORY DEVICE HAVING RESISTANCE UNIT

CROSS-REFERENCE TO RELATED APPLICATIONS

The present application claims priority of Korean Patent Application No. 10-2010-0068257, filed on Jul. 15, 2010, which is incorporated herein by reference in its entirety.

BACKGROUND OF THE INVENTION

Exemplary embodiments of the present invention relate to a technology for fabricating a semiconductor device, and more particularly, to a memory device.

Research has been conducted to develop next-generation memory devices that can replace a Dynamic Random Access Memory (DRAM) and a flash memory. Among the next-generation memory devices are Phase-change Random Access Memory (PRAM), Magnetic RAM (MRAM), Spin Transfer Torque RAM (STTRAM), Resistive RAM (ReRAM). The aforementioned next-generation memory devices are a kind of memory devices that store data based on a change in resistance. They have simple structures and great sensing current.

Figure 1:
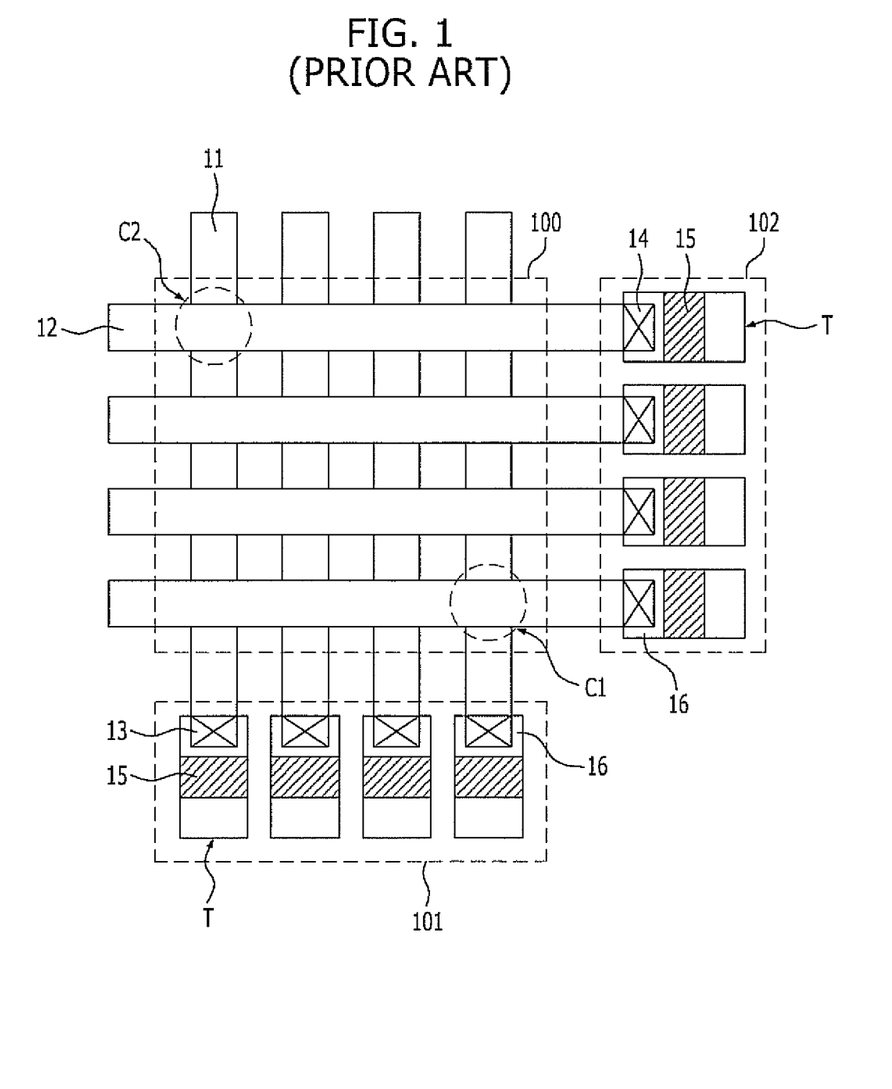
FIG. 1 is a plan view illustrating a conventional memory device.

FIG. 1 is a plan view illustrating a conventional memory device.

Referring to FIG. 1, the memory device includes a memory unit 100, a first driving unit 101, and a second driving unit 102. The memory unit 100 includes a plurality of first conductive lines 11 and second conductive lines 12 crossing each other and a variable resistance unit (not shown) interposed between them. Memory cells C1 and C2 are disposed at the cross points between the first conductive lines 11 and the second conductive lines 12. The first driving unit 101 controls voltages/currents of the first conductive lines 11 and includes a plurality of first contacts 13 through which the plurality of the first conductive lines 11 are coupled with the first driving unit 101, and the second driving unit 102 controls voltages/currents of the second conductive lines 12 and includes a plurality of second contacts 14 through which the plurality of the second conductive lines 12 are coupled with the second driving unit 102.

The first driving unit 101 and the second driving unit 102 includes a plurality of transistors T, respectively, and each transistor T includes a gate 15 and junction regions 16 disposed on both sides of the gate 15. Here, the plurality of the first contacts 13 and plurality of the second contacts 14 are coupled with the junction regions 16 between the memory unit 100 and the gates 15, respectively, and the gaps between the gates 15 and the plurality of the first contacts 13 and the gaps between the gates 15 and the plurality of the second contacts 14 are the same. Also, the areas of the junction regions 16 coupled with the plurality of the first contacts 13 and the plurality of the second contacts 14 are all the same.

However, the memory device having the above-described structure has a feature that the resistance difference according to the positions within the memory unit 100 which may occur in the process of sensing and programming may deteriorate the accuracy of data.

More specifically, a first memory cell C1 is disposed at a position closest to the first driving unit 101 and the second driving unit 102 in the memory unit 100. A second memory cell C2 is disposed at a position farthest from the first driving unit 101 and the second driving unit 102 in the memory unit 100. Here, looking at the line resistances between the first and second memory cells C1 and C2 and the first and second driving units 101 and 102, the first memory cell C1 has the smallest line resistance, while the second memory cell C2 has the greatest line resistance. As described above, when the line resistance difference occurs according to the positions where the first and second memory cells C1 and C2 are disposed and the resistance of a variable resistance unit interposed between the first conductive lines 11 and the second conductive lines 12 is not vastly greater than the line resistance, oxygen saturation amount of the memory unit 100 may be increased.

Here, diverse methods have been suggested in order to address such features caused by the resistance difference according to the position within the memory unit 100. The methods include a method of decreasing the size of the memory unit 100, a method of decreasing the resistances of the first conductive lines 11 and the second conductive lines 12, and a method of increasing the resistance of the variable resistance unit. The aforementioned methods, however, may result in increasing chip size, complicating manufacturing process and production costs, and lowering on/off ratio of memory cells.

SUMMARY OF THE INVENTION

An embodiment of the present invention is directed to a memory device that may lessen the resistance difference according to positions in a memory unit.

In accordance with an exemplary embodiment of the present invention, a memory device includes: a memory unit including a plurality of first conductive lines and a plurality of second conductive lines that cross the first conductive lines; and a driving unit module coupled with the plurality of the first conductive lines through respective ones of a plurality of contacts coupled with the plurality of the second conductive lines through respective ones of the plurality of contacts, wherein as the first conductive lines become farther from the driving unit module along a direction that the second conductive lines extend, the respective contacts of the first conductive lines have lower resistance values.

In accordance with another embodiment of the present invention, a memory device includes: a memory unit including a plurality of first conductive lines and a plurality of second conductive lines that cross the first conductive; a first driving unit including a plurality of transistors corresponding to the plurality of the first conductive lines; a second driving unit comprising a plurality of transistors corresponding to the plurality of the second conductive lines, respectively; and a plurality of contacts coupling the plurality of first conductive lines with junction regions of respective ones of the plurality of the transistors and coupling the plurality of second conductive lines with junction regions of respective ones of the plurality of the transistors, wherein as the first conductive lines become farther from the second driving unit along a direction that the second conductive lines extend, the respective contacts of the first conductive lines have lower resistance values.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
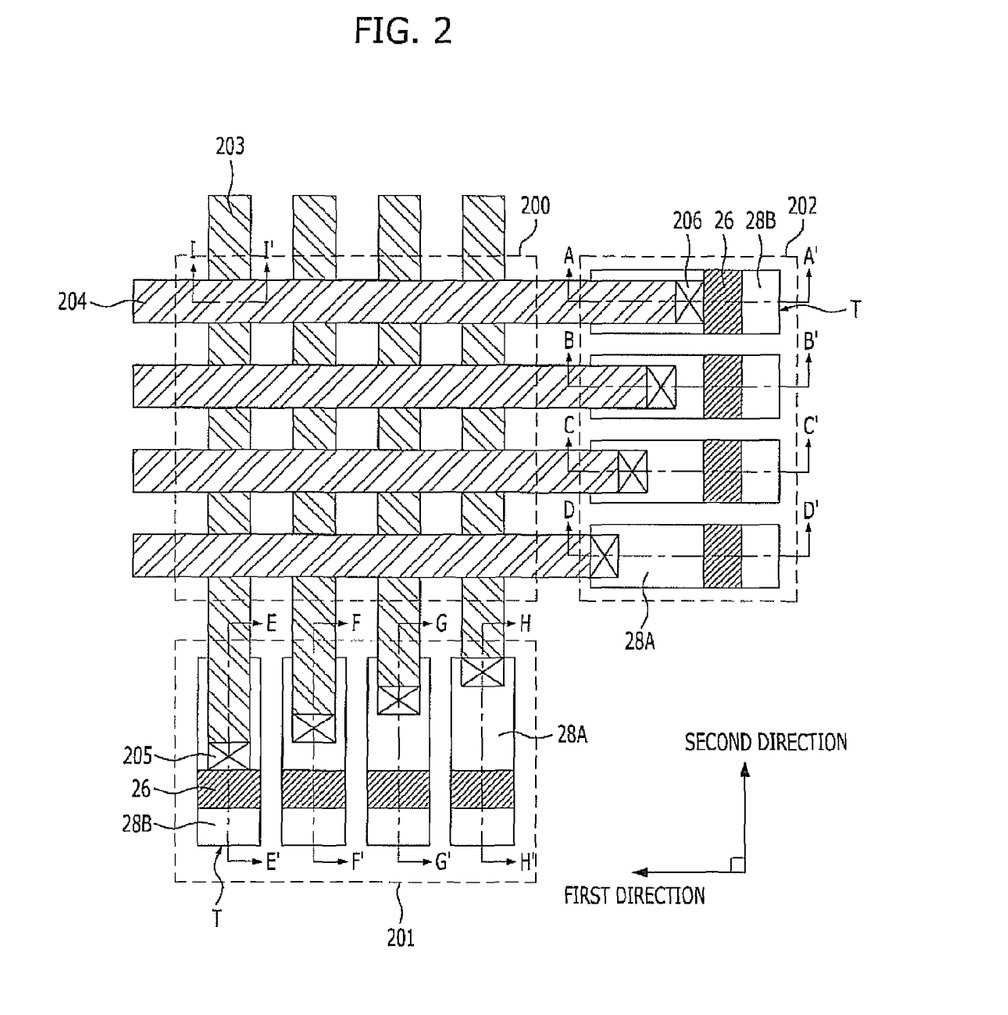
FIG. 2 is a plan view illustrating a memory device in accordance with an embodiment of the present invention.
Figure 3A:
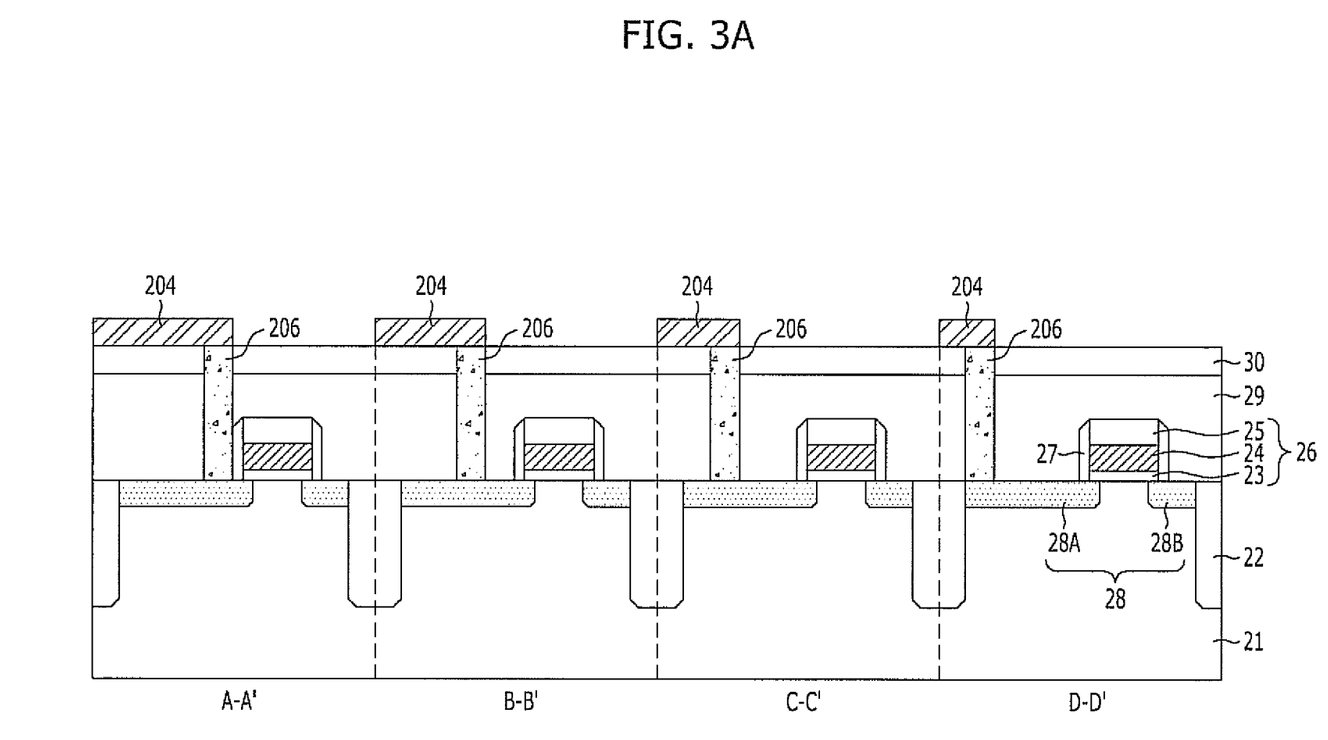
FIGS. 3A to 3C are cross-sectional views of the memory device illustrated in FIG. 2 taken along lines A-A' to I-I'.
Figure 3B:
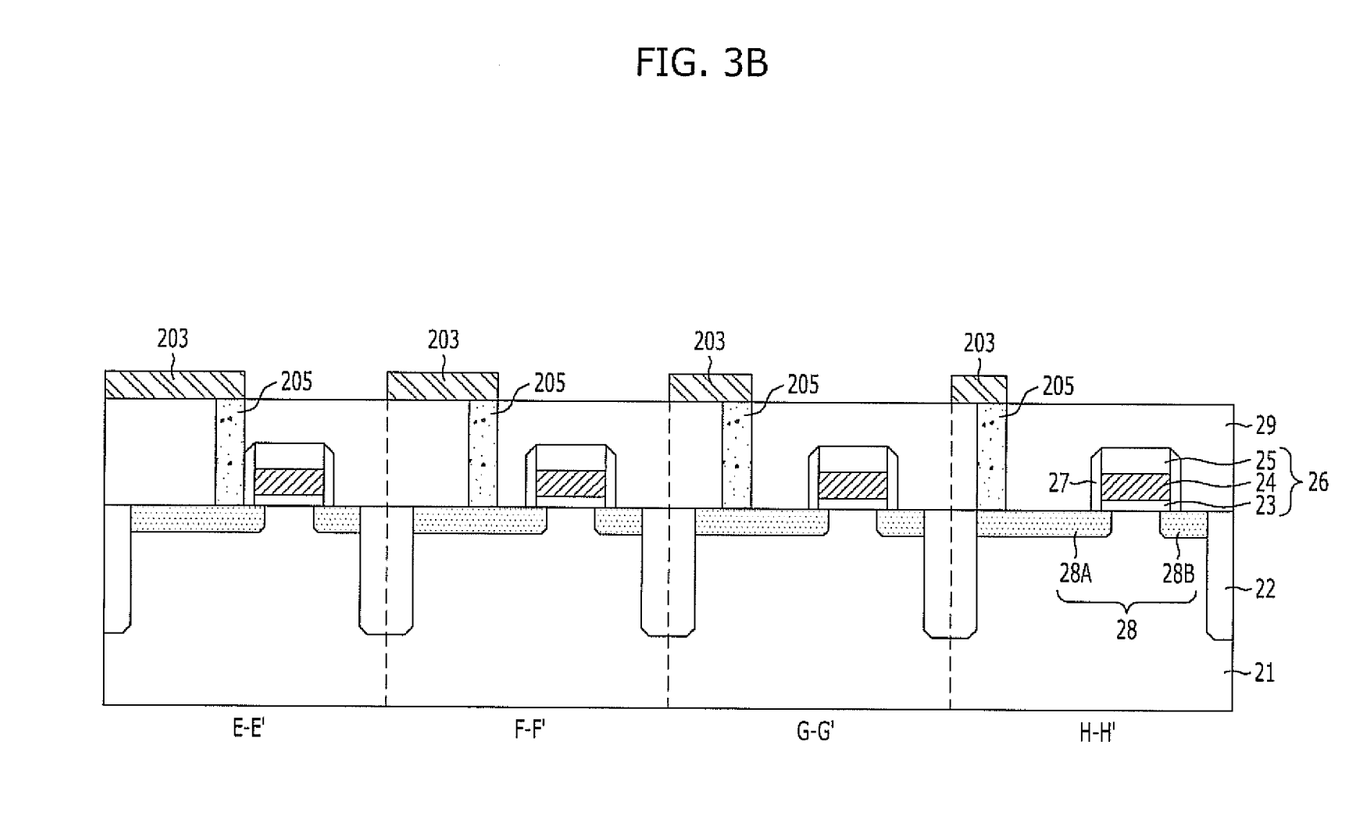
Figure 3C:
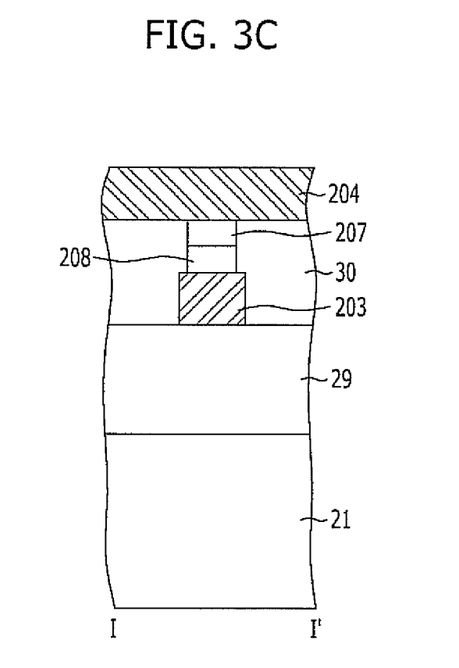

FIG. 2 is a plan view illustrating a memory device in accordance with an embodiment of the present invention. FIGS. 3A to 3C are cross-sectional views of the memory device illustrated in FIG. 2 taken along lines A-A' to I-I'. FIG. 3A is a cross-sectional view illustrating a second driving unit, and FIG. 3B is a cross-sectional view illustrating a first driving unit. FIG. 3C is a cross-sectional view illustrating a memory cell.

As shown in FIGS. 2, 3A, 3B and 3C, the memory device in accordance with an embodiment of the present invention includes a memory unit 200, a first driving unit 201, and a second driving unit 202, wherein the first driving unit 201 and the second driving unit 202 makes up a driving unit module.

The memory unit 200 includes a plurality of first conductive lines 203 and a plurality of second conductive lines 204 crossing each other and a variable resistance unit 207 interposed between them. More specifically, the memory unit 200 includes a first interlayer dielectric layer 29 formed over a substrate 21, a second interlayer dielectric layer 30 formed over the first interlayer dielectric layer 29, and the plurality of the first conductive lines 203 and the variable resistance units 207 that are formed in the second interlayer dielectric layer 30, and the plurality of the second conductive lines 204 formed over the variable resistance units 207. The variable resistance unit 207 has at least two resistance states, which includes a high resistance state and a low resistance state, by a bias applied through the corresponding first conductive line 203 and the corresponding second conductive line 204, and it stores data through the resistance states. The variable resistance unit applicable to one embodiment of the present invention will be described below with reference to FIGS. 4A and 4C.

Also, the memory unit 200 may further include a switch 208 interposed between the variable resistance unit 207 and the first conductive line 203. Here, the switch 208 may also be interposed between the variable resistance unit 207 and the second conductive line 204. The switch 208 may include a diode.

The first driving unit 201 in charge of controlling the plurality of the first conductive lines 203, and the second driving unit 202 in charge of the plurality of the second conductive lines 204 are formed of a plurality of transistors T coupled with the plurality of the first conductive lines 203 and the plurality of the second conductive lines 204, respectively. The first driving unit 201 includes a plurality of first contacts 205 through which the plurality of the first conductive lines 203 are coupled with the first driving unit 201, and the second driving unit 202 includes a plurality of second contacts 206 through which the plurality of the second conductive lines 204 are coupled with the second driving unit 202. The plurality of the first contacts 205 and the plurality of the second contacts 206 are coupled with junction regions 28 of the transistors T, but they are coupled at different positions of the junction regions 28 in order to lessen the resistance difference according to positions in the memory unit 200. More specifically, the plurality of the first contacts 205 and the plurality of the second contacts 206 are disposed in such a manner that as the cross point between the first conductive line 203 and the second conductive line 204 become farther from the first driving unit 201 and the second driving unit 202, the resistance values between the first and second contacts 205 and 206 corresponding to the cross point and the first second driving units 201 and 202 are decreased.

Both of the first driving unit 201 and the second driving unit 202 include the substrate 21, an isolation layer 22 which is formed over the substrate 21 and electrically disconnects the transistors T from each other, a gate 26 formed over the substrate 21, and a first junction region 28A and a second junction region 28B which are formed on the substrate 21 at both sides of the gate 26 and have different areas. The gate 26 has a structure that a gate insulation layer 23, a gate electrode 24, and a gate hard mask layer 25 are stacked, and spacers 27 are formed on both sidewalls of the gate 26.

The first driving unit 201 further includes the first interlayer dielectric layer 29 formed over the substrate 21, the plurality of the first contacts 205 coupled with the first junction region 28A and formed in the first interlayer dielectric layer 29, and the plurality of the first conductive lines 203 extended from the memory unit 200 and coupled with the plurality of the first contacts 205. The second driving unit 202 further includes the first interlayer dielectric layer 29 and the second interlayer dielectric layer 30 that are formed over the substrate 21, the plurality of the second contacts 206 coupled with the first junction region 28A and formed in the first interlayer dielectric layer 29 and the second interlayer dielectric layer 30, and the plurality of the first conductive lines 203 extended from the memory unit 200 and coupled with the plurality of the second contacts 206. Here, the plurality of the first contacts 205 and the plurality of the second contacts 206 include plugs, and the contact area between the plugs and the junction regions 28 are all the same.

The junction regions 28 are source/drain regions, and the area of the first junction region 28A disposed between the memory unit 200 and the gate 26 is greater than that of the second junction region 28B. The plurality of the first contacts 205 and the plurality of the second contacts 206 coupled with the first junction region 28A are disposed to be closer to the gate 26 along respective one of a first direction and a second direction. More specifically, the plurality of the first contacts 205 and the plurality of the second contacts 206 are disposed in such a manner that as the cross point of the first conductive line 203 and the second conductive line 204 become farther from the first driving unit 201 and the second driving unit 202, the space between the first and second contacts 205 and 206 corresponding to the cross point and the gate 26. This is to realize the increase in the resistance values of a first conductive line 203 and a second conductive line 204 that are coupled to a memory cell positioned relatively close to the first driving unit 201 and the second driving unit 202, compared with the resistance values of a first conductive line 203 and a second conductive line 204 that are coupled to a memory cell positioned farthest from those and thereby lessen the resistance difference of memory cells according to their positions inside the memory unit 200. Here, the increased resistance values of the first conductive line 203 and the second conductive line 204 correspond to the length of the first junction region 28A between the plurality of the first and second contacts 205 and 206 and the gate 26. In short, the resistance difference according to positions inside the memory unit 200 is lessened by using the internal resistors of the first driving unit 201 and the second driving unit 202.

The memory device fabricated in accordance with the embodiment of the present invention, which is described above, may lessen the resistance difference according to positions inside the memory unit 200 by controlling the positions of the plurality of the first contacts 205 and the plurality of the second contacts 206 which couple the plurality of the first and second conductive lines 203 and 204 with the first and second driving units 201 and 202. In this way, the accuracy of data may be prevented from decreasing due to the resistance difference according to positions inside the memory unit 200.

Meanwhile, since the area of the first junction region 28A coupled with the plurality of the first contacts 205 and the plurality of the second contacts 206 is increased to control the positions of the plurality of the first contacts 205 and the plurality of the second contacts 206, the areas of the first driving unit 201 and the second driving unit 202 may be increased compared with those of conventional technology. However, since the memory unit 200 may be integrated with more memory cells by decreasing the resistance difference according to positions inside the memory unit 200, the area of memory unit 20 is reduced relatively. Consequently, although the areas of the first driving unit 201 and the second driving unit 202 are increased, the area of the entire memory device may be decreased.

Also, the internal resistance provided through the first junction region 28A, which is the increased resistance of the plurality of the first conductive lines 203 and the plurality of the second conductive lines 204, may be easily controlled by using a method such as ion implantation with a less complicated process, which is advantageous.

FIGS. 4A to 4D are cross-sectional views illustrating a variable resistance unit that may be applied to a memory device in accordance with an embodiment of the present invention.

Figure 4A:
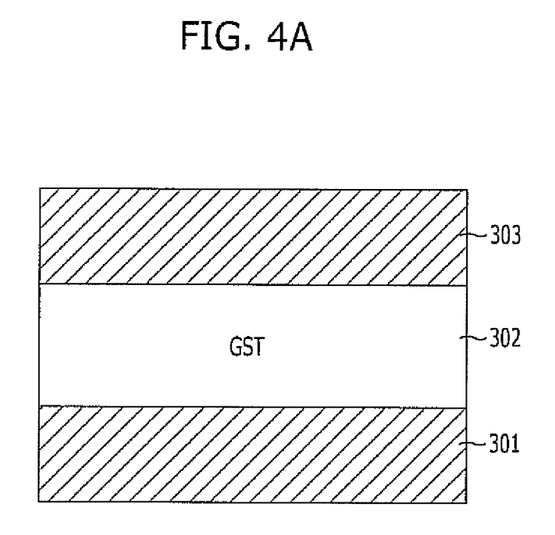
FIGS. 4A to 4D are cross-sectional views illustrating a variable resistance unit to be applied to a memory device in accordance with an embodiment of the present invention.

Referring to FIG. 4A, the variable resistance unit may have a structure that a first electrode 301, a phase-changing material layer 302, and a second electrode 303 are stacked sequentially.

The phase-changing material layer 302 has a resistance value that is changed as the crystal state of the layer is changed into an amorphous state (high resistance) or a crystalline state (low resistance) by an external stimulus, such as current or voltage. Here, the variable resistance unit may have a plurality of resistance values according to the extent that the phase-changing material layer 302 is changed into the amorphous state or a crystalline state. Also, the variable resistance unit may be formed to have a plurality of resistance values by serially coupling a plurality of structures each of which includes the first electrode 301, the phase-changing material layer 302, and the second electrode 303 stacked therein.

The phase-changing material layer 302 may include a chalcogen compound. The chalcogen compound that may be used for the phase-changing material layer 302 includes germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), 5A group element-antimony-tellurium (5A group element-Sb—Te), where the 5A group element includes tantalum (Ta), niobium (Nb), vanadium (V), and so forth, GA group element-antimony-tellurium (6A group element-Sb—Te), where the 6A group element includes tungsten (W), molybdenum (Mo), chrome (Cr), and so forth, 5A group element-antimony-selenium (5A group element-Sb—Se), or 6A group element-antimony-selenium (GA group element-Sb—Se). In general, GST which is prepared by mixing germanium-antimony-tellurium (Ge—Sb—Te) at a predetermined ratio is used as the phase-changing material layer 302.

Figure 4B:
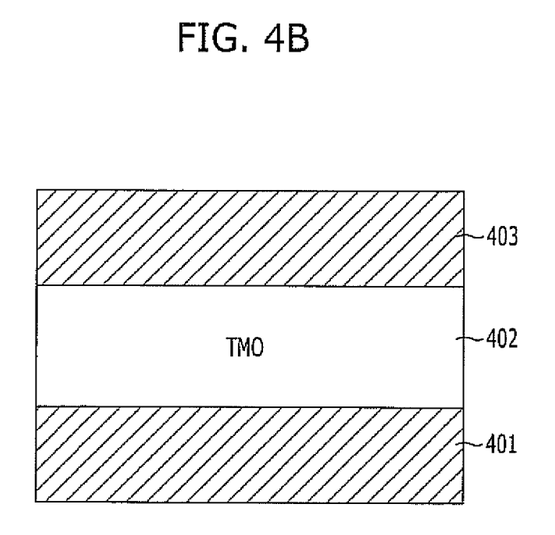

Referring to FIG. 4B, the variable resistance unit may have a structure that a first electrode 401, a variable resistance layer 402, and a second electrode 403 are sequentially stacked.

As for the variable resistance layer 402, a perovskite-based material or a binary oxide including a transition metal oxide (TMO) may be used. More specifically, the perovskite-based material includes SrTiO (STO) and PrCaMnO (PCMO), and the binary oxide includes nickel (Ni) oxide, titanium (Ti) oxide, hafnium (Hf) oxide, zirconium (Zr) oxide, tungsten (W) oxide, and cobalt (Co) oxide.

Here, when the variable resistance layer 402 is formed of the transition metal oxide (TMO), the variable resistance layer 402 includes a plurality of oxygen vacancies, and the resistance value is changed according to whether or not conductive filaments are formed due to re-arrangement of the oxygen vacancies caused by external stimulus, such as current or voltage, within the variable resistance layer 402. Here, the variable resistance unit may have a plurality of resistance values according to the extent of the conductive filaments generated. Also, the variable resistance unit may be formed to have a plurality of resistance values by serially coupling a plurality of structures each of which includes the first electrode 401, the variable resistance layer 402, and the second electrode 403.

Figure 4C:
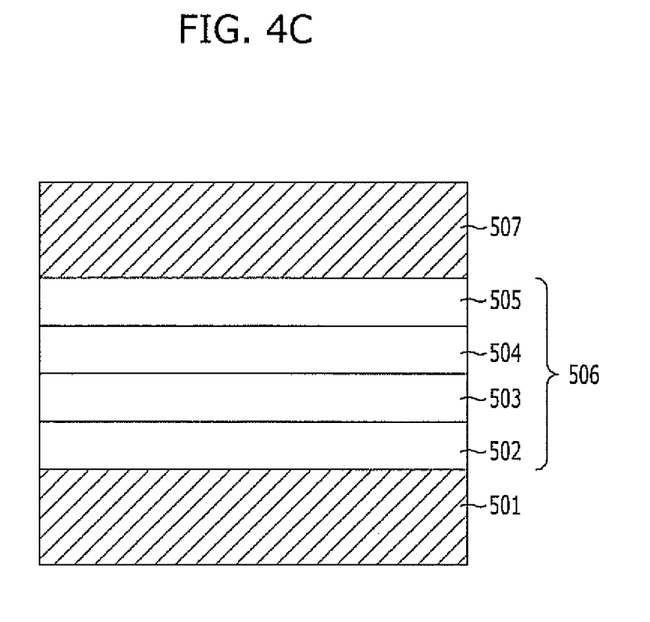

Referring to FIG. 4C, the variable resistance unit may have a structure where a first electrode 501, a magnetic tunnel junction layer 506, and a second electrode 507 are sequentially stacked.

The magnetic tunnel junction layer 506 may be a stacked layer where a pinning layer 502, a pinned layer 503, a tunnel insulator 504, and a free layer 505 are stacked. Here, the magnetic tunnel junction layer 506 has its resistance value changing according to the magnetization direction of the free layer 505 based on external stimulus, such as magnetic field or spin transfer torque (STT). Here, the magnetic tunnel junction layer 506 may have a plurality of resistance values according to the change extent of the magnetization direction of the free layer 505. Also, it may be formed to have a plurality of resistance values by serially coupling a plurality of structures each of which includes the first electrode 501, the magnetic tunnel junction layer 506, and the second electrode 507 stacked therein.

The pinning layer 502 may be of an antiferro_magnetic material to fix the magnetization direction of the pinned layer 503. As for the antiferromagnetic material, IrMn, PtMn, MnO, MnS, MnTe, $MnF_2$, $FeF_2$, $FeCl_2$, FeO, $CoCl_2$, CoO, $NiCl_2$ or NiO may be used.

The pinned layer 503 and the free layer 505 may be formed of a ferromagnetic material. As for the ferromagnetic material, Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO or $Y_3Fe_5O_{12}$ may be used.

The tunnel insulator 504 functions as a tunneling barrier between the pinned layer 503 and the free layer 505, and it may be formed of a magnesium oxide (MgO) layer, an aluminum oxide ($Al_2O_3$) layer, a silicon nitride ($Si_3N_4$) layer, a silicon oxynitride (SiON) layer, a silicon oxide ($SiO_2$) layer, a hafnium oxide ($HfO_2$) layer, or a zirconium oxide ($ZrO_2$)

layer. Besides, any materials having an insulation characteristic may be used for the tunnel insulator 504.

Figure 4D:
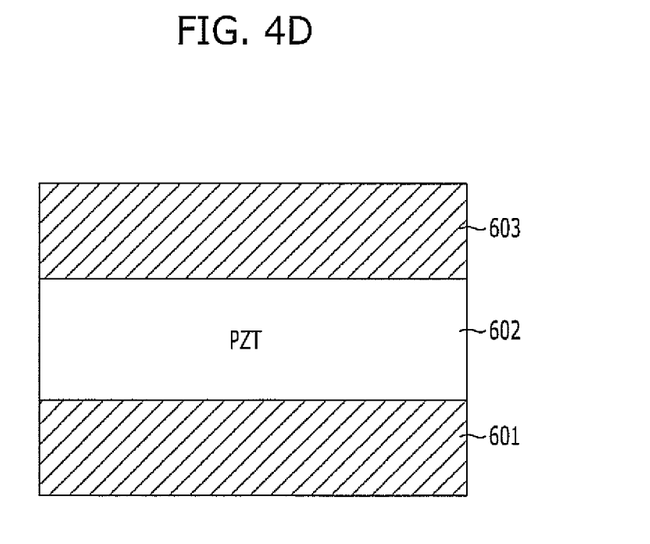

Referring to FIG. 4D, the variable resistance unit may have a structure where a first electrode 601, a ferroelectric layer 602, and a second electrode 603 are sequentially stacked.

The ferroelectric layer 602 has a spontaneous polarization characteristic. A polarization inversion is caused by external stimulus and changes the resistance value. Here, the variable resistance unit may have a plurality of resistance values according to the extent that the spontaneous polarization of the ferroelectric layer 602 is changed. Also, it may be formed to have a plurality of resistance values by serially coupling a plurality of structures each of which includes the first electrode 601, the ferroelectric layer 602, and the second electrode 603 that are stacked. As for the ferroelectric layer 602, SrBiTa (SBT), Perovskite materials or BiLaTi (BLT) may be used.

According to the embodiment of the present invention, the resistance difference according to the positions in a memory unit may be lessened by controlling the position of content coupling conductive lines with a driving unit. Therefore, the technology of the present invention may prevent the accuracy of data from being decreased due to the resistance difference according to the positions in the memory unit.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
a memory unit comprising a plurality of first conductive lines and a plurality of second conductive lines that cross the first conductive lines; and
a driving unit module coupled with the plurality of the first conductive lines through respective ones of a plurality of contacts and coupled with the plurality of the second conductive lines through respective ones of the plurality of contacts,
wherein the driving unit module comprises a plurality of transistors corresponding to the plurality of the first conductive lines and the plurality of the second conductive lines, respectively, and the plurality of the contacts are coupled with junction regions of the transistors,
wherein the plurality of the contacts comprise plugs, and contact areas between the junction regions of the plurality of the transistors and the plugs are the same,
wherein as cross points between the plurality of first conductive lines and the plurality of the second conductive lines become farther from the driving unit, a distance between the plurality of the contacts and gates of the plurality of the transistors is decreased.

2. The memory device of claim 1, wherein the memory unit further comprises:
a variable resistance unit interposed between a first one of the first conductive lines and a first one of the plurality of the second conductive lines.

3. The memory device of claim 2, wherein the variable resistance unit comprises any one selected from the group consisting of a phase-changing material layer, a variable resistance layer, a magnetic tunnel junction layer, and a ferroelectric layer.

4. The memory device of claim 2, further comprising:
a switch interposed between the first one of the plurality of the first conductive lines or the first one of the plurality of the second conductive lines and the varying resistance unit.

5. The memory device of claim 4, wherein the switch comprises a diode.

6. A memory device, comprising:
a memory unit comprising a plurality of first conductive lines and a plurality of second conductive lines that cross the first conductive lines;
a first driving unit comprising a plurality of transistors corresponding to the plurality of the first conductive lines, respectively;
a second driving unit comprising a plurality of transistors corresponding to the plurality of the second conductive lines, respectively; and
a plurality of contacts coupling the plurality of first conductive lines with junction regions of respective ones of the plurality of the transistors and coupling the plurality of second conductive lines with junction regions of respective ones of the plurality of the transistors,
wherein the plurality of the contacts comprise plugs, and contact areas between the first junction regions and the plugs are the sane,
wherein as a distance between the first driving unit and the plurality of second conductive lines become farther, a distance between the contacts of the second conductive lines and gates of the plurality of the transistors comprised in the second driving unit is decreased,
wherein as a distance between the second driving unit and the plurality of first conductive lines become farther, a distance between the contacts of the first conductive lines coupled and gates of the plurality of the transistors comprised in the first driving unit is decreased.

7. The memory device of claim 6, wherein the junction region of each of the plurality of the transistors comprises:
a first junction region between the memory unit and one side of the gate of each transistor; and
a second junction region on the other side of the gate,
wherein each of the plurality of the contacts is coupled with the first junction region.

8. The memory device of claim 7, wherein the first junction region has a greater area than the second junction region.

9. The memory device of claim 6, wherein the memory unit further comprises:
a variable resistance unit interposed between a first one of the plurality of the first conductive lines and a first one of the plurality of the second conductive line.

10. The memory device of claim 9, wherein the variable resistance unit comprises any one selected from the group consisting of a phase-changing material layer, a variable resistance layer, a magnetic tunnel junction layer, and a ferroelectric layer.

11. The memory device of claim 9, further comprising:
a switch interposed between the first one of the plurality of the first conductive lines or the first one of the plurality of the second conductive line and the variable resistance unit.

12. The memory device of claim 11, wherein the switch comprises a diode.

* * * * *